(12) United States Patent
Zhou

(10) Patent No.: US 8,922,262 B2
(45) Date of Patent: Dec. 30, 2014

(54) TIME SEQUENCE CIRCUIT FOR POWER SUPPLY UNIT

(71) Applicants: Hong Fu Jin Precision Industry (ShenZhen) Co., Ltd., Shenzhen (CN); Hon Hai Precision Industry Co., Ltd., New Taipei (TW)

(72) Inventor: Hai-Qing Zhou, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 14/142,917

(22) Filed: Dec. 29, 2013

(65) Prior Publication Data

US 2014/0184283 A1 Jul. 3, 2014

(30) Foreign Application Priority Data

Dec. 29, 2012 (CN) .......................... 2012 1 0588135

(51) Int. Cl.
*H03L 7/00* (2006.01)
*H03L 5/02* (2006.01)

(52) U.S. Cl.
CPC ....................................... *H03L 5/02* (2013.01)
USPC ......................................... 327/143; 327/142

(58) Field of Classification Search
USPC .................................................. 327/142, 143
See application file for complete search history.

(56) References Cited

U.S. PATENT DOCUMENTS

| 7,400,188 | B2* | 7/2008 | Huang et al. | 327/543 |
| 7,586,346 | B2* | 9/2009 | Xiong | 327/143 |
| 7,683,686 | B2* | 3/2010 | Wang et al. | 327/198 |
| 8,536,909 | B1* | 9/2013 | Chen et al. | 327/143 |
| 2012/0086481 | A1* | 4/2012 | Chao et al. | 327/143 |
| 2012/0268175 | A1* | 10/2012 | Zhou | 327/143 |
| 2013/0057324 | A1* | 3/2013 | Tu et al. | 327/143 |
| 2014/0189412 | A1* | 7/2014 | Zhou | 713/330 |

* cited by examiner

*Primary Examiner* — Ryan Jager
(74) *Attorney, Agent, or Firm* — Novak Druce Connolly Bove + Quigg LLP

(57) ABSTRACT

A time sequencing circuit for a power supply unit to ensure the correct sequencing of system voltages for a computer from a power supply unit includes first to ninth resistors, first to fifth electronic switches, and a capacitor. Each of the first to fifth electronic switches includes first to third terminals. When the power supply unit outputs all required voltages, the power supply unit outputs a high-voltage level indicating power good and the computer can start up. If any one of the required voltages is not being outputted, the power supply unit outputs a low-voltage level good signal until any non-output of voltage is cured.

3 Claims, 1 Drawing Sheet

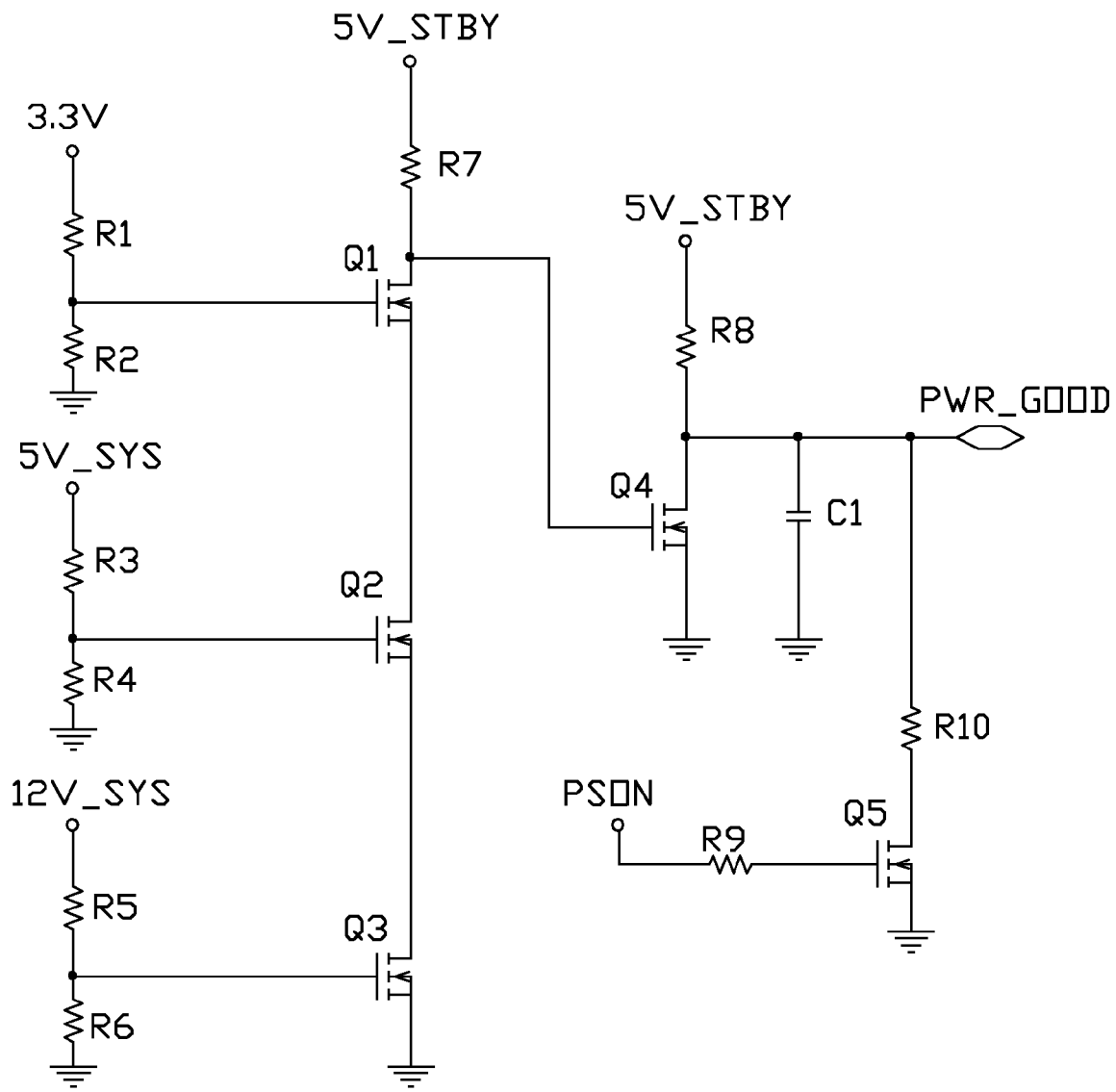

1 …

TIME SEQUENCE CIRCUIT FOR POWER SUPPLY UNIT

BACKGROUND

1. Technical Field

The present disclosure relates to a time sequence circuit for a power supply unit.

2. Description of Related Art

During a power-on operation of a computer, a motherboard of the computer may change a power-on signal PS_ON from a high-voltage level to a low-voltage level. When a power supply unit receives the low-voltage level power-on signal PS_ON, the power supply unit simultaneously outputs different voltages, such as 3V3, 5V_SYS, 5V_STBY, and 12V_SYS voltages. When all the different voltages are being outputted, the power supply unit outputs a high-voltage level power good signal after 100-500 milliseconds, and then the computer can start up. However, a user may have different types of power supply units, of which the sequencing of the power supply unit is unsuitable for the motherboard.

Therefore, there is room for improvement in the art.

BRIEF DESCRIPTION OF THE DRAWING

Many aspects of the present disclosure can be better understood with reference to the following drawing(s). The components in the drawing(s) are not necessarily drawn to scale, the emphasis instead being placed upon clearly illustrating the principles of the present disclosure.

The FIGURE is a circuit diagram of an embodiment of a time sequence circuit for a power supply unit.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

The FIGURE illustrates an embodiment of a time sequence circuit for a power supply unit.

The time sequence circuit comprises ten resistors R1-R10, five metal oxide semiconductor field effect transistors (MOSFETs) Q1-Q5, and a capacitor C1.

A gate of the MOSFET Q1 is coupled to a system power terminal 3.3V through the resistor R1, and is connected to ground through the resistor R2. A drain of the MOSFET Q1 is coupled to a stand-by power terminal 5V_STBY through the resistor R7, and is also coupled to a gate of the MOSFET R4. A gate of the MOSFET Q2 is coupled to a system power terminal 5V_SYS through the resistor R3, and is connected to ground through the resistor R4. A drain of the MOSFET Q2 is coupled to a source of the MOSFET Q1. A gate of the MOSFET Q3 is coupled to a system power terminal 12V_SYS through the resistor R5, and is connected to ground through the resistor R6. A source of the MOSFET Q3 is connected to ground, and a drain of the MOSFET Q3 is coupled to a source of the MOSFET Q2. A source of the MOSFET Q4 is connected to ground, and a drain of the MOSFET Q4 is coupled to the stand-by power terminal 5V_STBY through the resistor R8, and is connected to ground through the capacitor C1. The drain of the MOSFET Q4 outputs a power good signal (PWR_GOOD). A gate of the MOSFET Q5 is coupled to a motherboard through the resistor R9, to receive a power on signal PS_ON from a motherboard. A source of the MOSFET Q5 is connected to ground, and a drain of the MOSFET Q5 is coupled to the drain of the MOSFET Q4 through the resistor R10.

During a power-on operation, if one of the system power terminals 3.3V, 5V_SYS, and 12V_SYS fails to output a system voltage, one of the MOSFETs Q1, Q2, or Q3 is turned off. For example, if the system power terminal 3.3V does not output that system voltage, the MOSFETs Q2 and Q3 are turned on, and the MOSFET Q1 is turned off. The gate of the MOSFET Q4 is coupled to the system power terminal 5V_STBY through the resistor R7, and the MOSFET Q4 is turned on. Resistances of the resistors R3-R6 can be changed to make the bases of the MOSFETs Q2 and Q2 be at a high-voltage level, such as logic 1, to make the MOSFETs Q1 and Q2 turn on. The power on signal PS_ON is at a low-voltage level, such as logic 0. During the power on operation, the MOSFET D5 is turned off, and the drain of the MOSFET Q4 is at a low-voltage level. Accordingly, the MOSFET Q4 outputs a low-voltage level power good signal.

During the power-on operation, when the system power terminals 3.3V, 5V_SYS, and 12V_SYS all output system voltages, the MOSFETs Q1, Q2, and Q3 are turned on, and the gate of the MOSFET Q4 is at the low-voltage level. Accordingly, the MOSFET Q1 is turned off, and the drain of the MOSFET Q4 is at a high-voltage level. The stand-by power terminal 5V_STBY charges the capacitor C1 by way of delay for a predefined time duration. When the capacitor C1 is fully charged, the drain of the MOSFET Q4 then outputs the high-voltage level power good signal.

When in a stand-by state, the power on signal PS_ON is at the high-voltage level. Thus, the MOSFET Q5 is turned on, making the drain of the MOSFET Q4 output a low-voltage level, that is, a power good signal.

In the embodiment, the transistors Q1 and Q2 are npn-type transistors. In other embodiments, the transistors can be replaced by other electronic switches, such as metal-oxide semiconductor field-effect transistors.

While the disclosure has been described by way of example and in terms of a preferred embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A time sequence circuit, comprising:
   a first to ninth resistor;
   a first to fifth electronic switch each comprising a first terminal, a second terminal, and a third terminal; and
   a capacitor;
   wherein the first terminal of the first electronic switch is coupled to a first power terminal through the first resistor, connected to ground through the second resistor, and the second terminal of the first electronic switch is connected to ground; the first terminal of the second electronic switch is coupled to a second system power terminal through the third resistor, and is connected to ground through the fourth resistor, the second terminal of the second electronic switch is coupled to the third terminal of the first electronic switch, the first terminal of the third electronic switch is coupled to a third system power terminal through the fifth resistor, and is connected to ground through the sixth resistor, the second terminal of the third electronic switch is coupled to the third terminal of the second electronic switch, and the third terminal of the third electronic switch is coupled to a stand-by power terminal through the seventh resistor, and is coupled to the first terminal of the fourth electronic switch; the second terminal of the fourth electronic switch is connected to ground, and the third terminal of the fourth electronic switch is coupled to the stand-by power terminal through the eighth resistor, and is connected to ground through the capacitor; the third terminal of the fourth electronic switch is used to output a power good signal, the first terminal of the fifth electronic switch receives a power on signal, the second terminal of the fifth electronic switch is connected to ground, and the third terminal of the fifth electronic switch is coupled to the third terminal of the fourth electronic switch through the ninth resistor; when the first terminals of the first to fifth electronic switches are at a low-voltage level, the second and third terminals of each electronic switch are disconnected from each other; when the first terminals of the first to fifth electronic switches are at a high-voltage level, the second and third terminals of each electronic switch are connected to each other.

2. The time sequence circuit of claim 1, further comprising a tenth resistor, wherein the first terminal of the fifth electronic switch receives the power on signal through the tenth resistor.

3. The time sequence circuit of claim 2, wherein the first to fifth electronic switches are n-channel metal oxide semiconductor field effect transistors (NMOSFETs), and the first terminals, second terminals, and the third terminals of the first to fifth electronic switches are gates, sources, and drains of the NMOSFETs, respectively.

* * * * *